United States Patent [19]

DiSilvestro

[11] Patent Number: 4,570,137

[45] Date of Patent: Feb. 11, 1986

[54] LUMPED-MODE RESONATOR

[75] Inventor: Raymond F. DiSilvestro, Phoenix, Ariz.

[73] Assignee: Motorola, Inc., Schaumburg, Ill.

[21] Appl. No.: 646,736

[22] Filed: Sep. 4, 1984

[51] Int. Cl.[4] .......................... H01P 7/06; H01P 1/30; H03H 5/10

[52] U.S. Cl. .................................... 333/219; 333/185; 333/229; 333/235

[58] Field of Search ............... 333/219, 229, 234, 185, 333/202, 222, 227, 232; 324/316–318; 331/16, 176; 361/274, 282, 321

[56] References Cited

U.S. PATENT DOCUMENTS

| | | | |
|---|---|---|---|
| 2,549,923 | 4/1951 | O'Brien | 331/176 |
| 4,195,326 | 3/1980 | Ruegg et al. | 361/274 |
| 4,446,429 | 5/1984 | Froncisz et al. | 333/235 |
| 4,480,239 | 10/1984 | Hyde et al. | 333/219 |
| 4,504,788 | 3/1985 | Froncisz et al. | 333/219 X |

*Primary Examiner*—Marvin L. Nussbaum
*Attorney, Agent, or Firm*—Raymond J. Warren

[57] ABSTRACT

An apparatus and method is disclosed for providing a lumped-mode resonator having increased mechanical stability through mounting of the gap of the lumped-mode resonator to a fixed surface. Temperature stability is also enhanced through attaching the resonator to a printed circuit capacitor whose capacitance will vary in a manner to offset any changes in the inductance of the resonator due to temperature variations. This will maintain a substantially constant resonant frequency over varying temperature conditions.

9 Claims, 4 Drawing Figures

-PRIOR ART-

-PRIOR ART-

FIG. 3
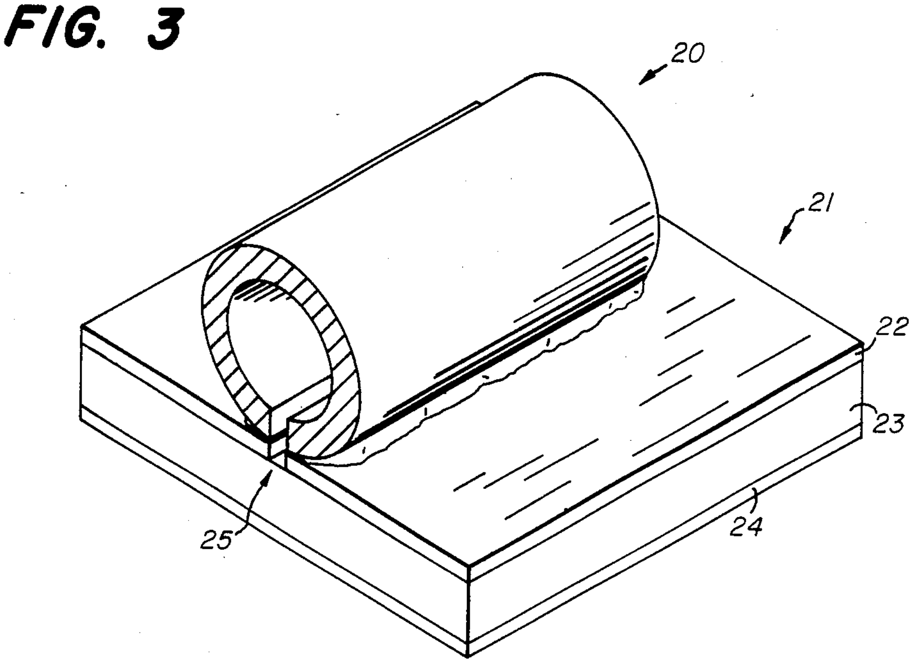
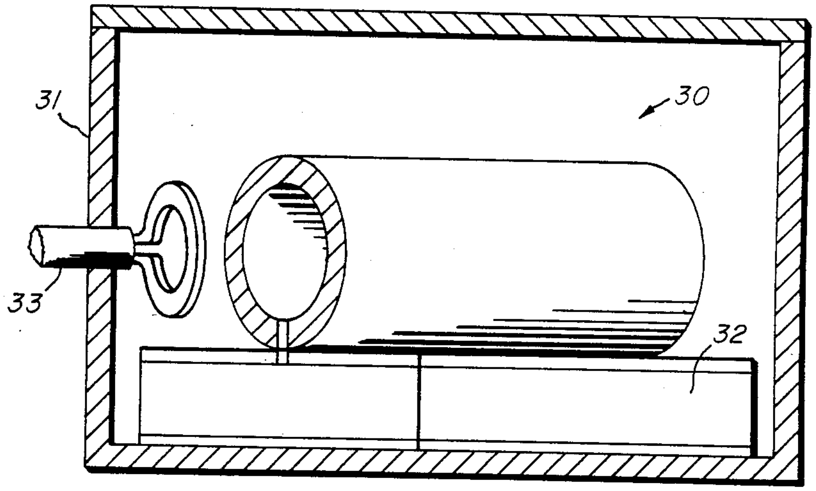
FIG. 4

LUMPED-MODE RESONATOR

BACKGROUND OF THE INVENTION

1. Field of the Invention

This invention relates, in general, to resonators and, more particularly, to lumped-mode resonators.

2. Description of the Background

Present lumped-mode resonators may be described as a metal cylindrical loop, representing the inductance, and a gap, representing the capacitance. These resonators encounter problems from temperature varying the inductance, due to the temperature coefficient, thereby changing the resonant frequency. Further, vibration and temperature cause variations in the gap of the resonator also causing changes in the resonant frequency.

Lumped-mode resonators are generally placed in a shielded enclosure composed of a circular waveguide with a cut-off frequency well above the resonant frequency of the resonator. This type of configuration makes tuning the resonator very difficult.

SUMMARY OF THE INVENTION

Accordingly, it is an object of the present invention to provide a resonator apparatus and method that will provide mechanical rigidity against vibration.

Another object of the present invention is to provide a resonator apparatus and method having an improved temperature response.

Still another object of the present invention is to provide a resonator apparatus and method having tunability.

The above and other objects and advantages of the present invention are provided by an apparatus and method of securing a lumped-mode resonator to a printed circuit capacitor.

A particular embodiment of the present invention comprises an apparatus and method of securing a lumped-mode resonator to a printed circuit capacitor thereby reducing variations in the gap due to vibration. The dielectric material of the printed circuit capacitor is selected to have a temperature coefficient that will induce changes in the capacitance offsetting any major changes in the resonator due to temperature variations.

BRIEF DESCRIPTION OF THE DRAWINGS

FIG. 3 is a perspective view of a lumped-mode resonator embodying the present invention; and FIG. 4 is a perspective view, a portion thereof being cut away, of a shielded lumped-mode resonator embodying the present invention.

DETAILED DESCRIPTION OF THE DRAWINGS

Figure 1:
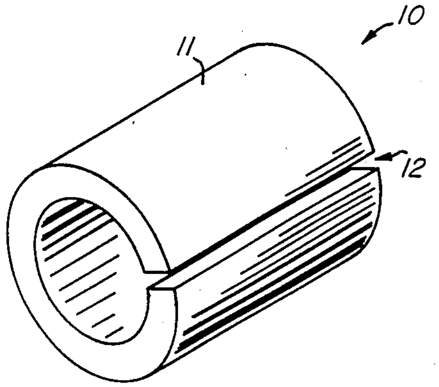
FIG. 1 is a perspective view of a prior art lumped-mode resonator.

Referring to the diagram of FIG. 1 a prior art lumped-mode resonator, generally designated 10, is illustrated. The frequency of resonator 10 is defined by the loop of a metal cylindrical body 11 and a gap 12 in body 11. The function of lumped-mode resonators, such as illustrated here, are well known in the art and as such will not be defined herein. It is sufficient for the purpose of the present invention to note that the frequency at which the resonator operates is defined by the inductance and the capacitance of the loop and gap 12 of the resonator.

Figure 2:
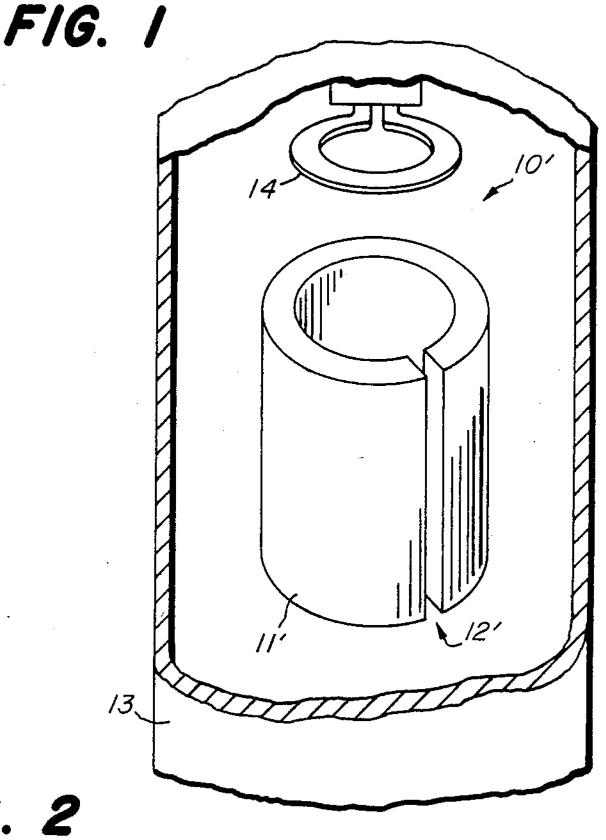
FIG. 2 is a perspective view, a portion thereof being cut away, of a prior art lumped-mode resonator in a shielded enclosure.

Referring now to FIG. 2 a perspective view, a portion thereof being cut away, of a prior art lumped-mode resonator, generally designated 10′, set in a shielded enclosure 13 is illustrated. A coupling loop 14 is illustrated at one end of resonator 10′. Loop 14 may be used to transmit power to or remove power from resonator 10′. Shielding 13 is provided to prevent radiation loss. These types of resonators encounter problems from varying temperatures causing the inductance to vary due to the temperature coefficient of resonator 10′; and from temperature and vibration causing gap 12′ to vary thereby causing the capacitance to vary. As gap 12′ increases the capacitance decreases causing the frequency at which the resonator operates to increase.

Referring now to FIG. 3, a perspective view of a lumped-mode resonator, generally designated 20, embodying the present invention is illustrated. Resonator 20 is shown affixed to a printed circuit capacitor 21. Capacitor 21 consists of an electrically conductive plate 22, another conductive plate shown as ground plane 24, and a dielectric 23 therebetween. A groove 25 is cut in conductor 22 to correspond to the gap in resonator 20. Grove 25 is required to prevent conductor 22 from shorting the gap. Resonator 20 is soldered, or fixedly attached, to conductor 22 which in turn is secured to dielectric 23. This prevents the gap of resonator 20 from varying due to vibration and temperature which greatly reduces the effects of frequency drift on the resonant frequency. The resonant frequency of resonator 20 may be adjusted by either varying the size of conductor 22 or the capacitance of capacitor 21.

The effects of temperature are greatly reduced from the prior art through careful selection of dielectric material 23. The changes in inductance of resonator 20, caused by temperature changes, may be offset by the changes in capacitance due to the temperature coefficient of dielectric 23. By selecting the proper dielectric material (e.g. duriod) changes in resonator 20 will be temperature compensated over certain temperature ranges. Thus, as a change in temperature will cause a change in inductance of resonator 20 it will also cause a change in capacitance of printed circuit capacitor 21 that will serve to provide an improved resonant frequency stability.

Referring now to FIG. 4 a perspective view, a portion thereof being cut away, of a shielded lumped-mode resonator, generally designated 30, embodying the present invention is illustrated. A shield 31 is placed around resonator 30 which is mounted on a capacitor 32. Also illustrated is a coupling loop 33 for removing power from, or providing power to, resonator 30.

Thus, it is apparent that there has been provided, in accordance with the invention, a device and method that fully satisfies the objects, aims, and advantages set forth above.

It has been shown that the present invention provides a lumped-mode resonator having improved temperature response through selection of a dielectric material having offsetting temperature characteristics. It has further been shown that the present invention provides mechanical rigidity over the prior art by fixedly attaching the resonator to the printed circuit capacitor.

While the invention has been described in conjunction with specific embodiments thereof, it is evident that many alterations, modifications, and variations will be apparent to those skilled in the art in light of the foregoing description. Accordingly, it is intended that the appended claims imbrace all such alternatives, modifications, and variations as appear in the spirit and scope of the appended claims.

I claim:

1. Resonator apparatus comprising:

a tubularly shaped lumped-mode resonator having an inductance and an axially extending gap being defined by a first wall and second wall of said lumped-mode resonator, the gap and the inductance determine a resonate frequency of said lumped-mode resonator:

a first conductor being connected tangentially to an outside wall of said lumped-mode resonator, said first conductor having a first end being disposed in a planar relation to said first wall of said lumped-mode resonator defining the gap;

a second conductor being connected tangentially to said lumped-mode resonator, said second conductor having a first end disposed in a planar relation to said first end of said second wall of said lump-mode resonator defining the gap, said first end of said second conductor being further disposed opposite and juxtaposed to said first end of said first conductor;

a dielectric material being connected to said first and second conductors opposite said lumped-mode resonator; and a third conductor being connected to said dielectric material opposite said first and second conductors.

2. The apparatus of claim 1 wherein said dielectric material comprises a capacitance whereby changes in temperature cause said capacitance to vary.

3. The apparatus of claim 2 further comprising a shield surrounding said lumped-mode resonator, said first, second and third conductors, and said dielectric material.

4. The apparatus of claim 3 further comprising a coupling loop adjustably coupled to an extending through said shielding.

5. Resonator apparatus comprising:

a tubularly shaped lumped-mode resonator having a resonate frequency, an axially disposed gap and an inductance, the gap being defined by a first wall and a second wall of said lumped-mode resonator, said inductance of said lumped-mode resonator varying with variations in temperature and said resonator frequency varying with variations in said inductance;

a first conductor being tangentially connected to an outside wall of said lumped-mode resonator, said first conductor having a first end being disposed in a planar relation to said first wall defining the gap of said lump-mode resonator;

a second conductor being tangentially connected to said outside wall of said lumped-mode resonator, said second conductor having a first end disposed in a planar relation to said second wall defining the gap of said lumped-mode resonator, said first end of said second conductor being further disposed opposite and juxtaposed to said first end of said first conductor;

a dielectric material being connected to said first and second conductors opposite said lumped-mode resonator, said dielectric material defining a capacitance, said capacitance varying with changes in temperature, said changes in capacitance of said dielectric material being selected to offset changes in said inductance of said lumped-mode resonator thereby maintaining a substantially constant resonate frequency; and a third conductor being connected to said dielectric material opposite said first and second conductors.

6. The apparatus of claim 5 further comprising a shield surrounding said lumped-mode resonator, said first and second conductors, said dielectric material and said third conductor.

7. The apparatus of claim 6 further comprising a coupling loop adjustably coupled to and extending through said shield.

8. Resonator apparatus comprising:

a tubularly shaped lumped-mode resonator having first and second axially extending walls defining an axially extending gap in a side thereof, the gap defining the capacitance of said lumped-mode resonator;

a printed circuit capacitor including a pair of juxtaposed metal plates having a dielectric therebetween, one of said pair of plates having a first wall and a second wall defining a groove therein; and said printed circuit capacitor being fixedly attached to said lumped-mode resonator with first and second walls of said lumped-mode resonator being disposed in a planar relation to said first and second walls respectively of said printed circuit capacitor, the groove of said printed circuit capacitor being positioned in overlying relationship to the gap in said resonator for reducing movement of said resonator gap.

9. The resonator apparatus of claim 8 wherein said dielectric of said printed circuit capacitor is formed of material that alters the capacitance of said printed capacitor with temperature changes to substantially offset changes in said lumped-mode resonator with the temperature changes.

* * * * *